(12) United States Patent
Li

(10) Patent No.: US 12,389,683 B2
(45) Date of Patent: Aug. 12, 2025

(54) DISPLAY PANEL HAVING REDUCED SIGNAL LOAD

(71) Applicant: TCL CHINA STAR OPTOELECTRONICS TECHNOLOGY CO., LTD., Shenzhen (CN)

(72) Inventor: Hui Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/778,853

(22) PCT Filed: May 17, 2022

(86) PCT No.: PCT/CN2022/093311
§ 371 (c)(1),
(2) Date: May 22, 2022

(87) PCT Pub. No.: WO2023/201808
PCT Pub. Date: Oct. 26, 2023

(65) Prior Publication Data
US 2024/0162237 A1 May 16, 2024

(30) Foreign Application Priority Data
Apr. 18, 2022 (CN) .......................... 202210405989.9

(51) Int. Cl.
*H10D 86/60* (2025.01)
*H01L 25/075* (2006.01)
(Continued)

(52) U.S. Cl.
CPC ......... *H10D 86/60* (2025.01); *H01L 25/0753* (2013.01); *H01L 25/167* (2013.01); *H10D 86/441* (2025.01); *H10H 20/857* (2025.01)

(58) Field of Classification Search
CPC . H01L 27/124; H01L 25/0753; H01L 25/167; H01L 33/62; H10D 86/60; H10D 86/441; H10H 20/857
(Continued)

(56) References Cited

U.S. PATENT DOCUMENTS

| | | | |
|---|---|---|---|
| 10,665,619 B2 * | 5/2020 | Wang | H01L 27/1255 |
| 2011/0233567 A1 * | 9/2011 | Li | H01L 27/12 257/E33.062 |

(Continued)

FOREIGN PATENT DOCUMENTS

| | | | |
|---|---|---|---|
| CN | 106019747 A | 10/2016 | |
| CN | 108492760 A | 9/2018 | |

(Continued)

OTHER PUBLICATIONS

PCT International Search Report for International Application No. PCT/CN2022/093311, mailed on Dec. 15, 2022.
(Continued)

*Primary Examiner* — Eric W Jones
(74) *Attorney, Agent, or Firm* — The Roy Gross Law Firm, LLC; Roy D. Gross

(57) ABSTRACT

The embodiments of present the application disclose a display panel. The display panel includes a substrate disposed with a plurality of scanning lines and a plurality of data lines. A light-emitting component includes three scanning lines and two light-emitting units, and a light-emitting unit includes a plurality of sub light-emitting pixels. A number of the data lines is less than a number of the sub light-emitting pixels in the light-emitting unit, and a product of the number of the data lines and the number of the scanning lines is greater than or equal to the number of the sub light-emitting pixels. By electrically connecting the two light-emitting units with the three scanning lines, a load of the data lines is reduced and display effects are improved.

19 Claims, 7 Drawing Sheets

(51) Int. Cl.
*H01L 25/16* (2023.01)
*H10D 86/40* (2025.01)
*H10H 20/857* (2025.01)

(58) Field of Classification Search
USPC .......................................................... 257/79
See application file for complete search history.

(56) References Cited

U.S. PATENT DOCUMENTS

2018/0240421 A1* 8/2018 Yamazaki ............. G09G 3/3648
2018/0331125 A1* 11/2018 Wang .................... H01L 27/124
2019/0355754 A1* 11/2019 Wang .................... G11C 19/28

FOREIGN PATENT DOCUMENTS

| CN | 110333632 A | 10/2019 |
| CN | 111446262 A | 7/2020 |
| CN | 112331157 A | 2/2021 |
| JP | 2006243526 A | 9/2006 |
| JP | 2009008840 A | 1/2009 |

OTHER PUBLICATIONS

PCT Written Opinion of the International Searching Authority for International Application No. PCT/CN2022/093311, mailed on Dec. 15, 2022.

\* cited by examiner

DISPLAY PANEL HAVING REDUCED SIGNAL LOAD

CROSS REFERENCE TO RELATED APPLICATIONS

This application is a National Phase of PCT Patent Application No. PCT/CN2022/093311 having International filing date of May 17, 2022, which claims the benefit of priority of Chinese Patent Application No. 202210405989.9, filed Apr. 18, 2022, the contents of which are all incorporated herein by reference in their entirety.

FIELD OF INVENTION

The present application relates to a field of display, in particular, to a display panel.

Description of Prior Art

In a traditional pixel architecture design process of display panels, a plurality of sub light-emitting pixels are distributed on a substrate in an array, and correspondingly, a plurality of scanning lines and a plurality of data lines are also distributed on the substrate in an array. Among them, a number of the scanning lines corresponds to a number of rows of the sub light-emitting pixels, and a number of the data lines corresponds to a number of columns of the sub light-emitting pixels, that is, one of the scanning lines is arranged between two adjacent rows of the sub light-emitting pixels, and one of the data lines is arranged between two adjacent columns of the sub light-emitting pixels. When the number of rows of the sub light-emitting pixels is large, the number of the sub light-emitting connected to each data line is large, resulting in a large load on a data line, and a light-emitting difference between the sub light-emitting pixels connected to the data line is large, resulting in poor overall display effects of the display panel.

Technical Problem

The embodiments of the present application provide a display panel, which can solve a problem of poor overall display effect of existing display panels.

SUMMARY

The Embodiments of the Present Application Provide a Display Panel, Comprising:
  a substrate disposed with a plurality of scanning lines and a plurality of data lines, wherein the plurality of scanning lines extend along a first direction and are arranged in parallel along a second direction, the plurality of data lines extend along the second direction and are arranged in parallel along the first direction, and the first direction is at an included angle with the second direction;
  a plurality of light-emitting components arranged on the substrate in parallel along the first direction, wherein each of the light-emitting components comprises three of the data lines and two light-emitting units arranged in parallel along the first direction; each of the light-emitting units comprises a plurality of light-emitting pixels arranged in parallel along the second direction, and each of the light-emitting pixels comprises a plurality of sub light-emitting pixels arranged in parallel along the second direction; each of the sub light-emitting pixels is electrically connected with one of the data lines of the light-emitting components;
  wherein a number of the scanning lines is less than a number of the sub light-emitting pixels in one of the light-emitting units; a product of the number of the scanning lines and a number of the data lines in one of the light-emitting components is greater than or equal to a number of the sub light-emitting pixels in one of the light-emitting components.

Alternatively, in some embodiments of the present application, two of the data lines of one of the light-emitting components are arranged between the two light-emitting units of the one of the light-emitting components; one of the light-emitting units of the light-emitting components is arranged between two of the data lines of the one of the light-emitting components.

Alternatively, in some embodiments of the present application, along the first direction, two of the data lines and one of the data lines are alternately arranged between adjacent two of the light-emitting units in turn.

Alternatively, in some embodiments of the present application, the two light-emitting units of at least part of the light-emitting components are arranged between two of the data lines of the light-emitting components, respectively.

Alternatively, in some embodiments of the present application, along the first direction, one of the data lines and two of the data lines are alternately arranged between adjacent two of the light-emitting units in turn.

Alternatively, in some embodiments of the present application, distribution modes of the three of the data lines in the plurality of the light-emitting components are same.

Alternatively, in some embodiments of the present application, the three of the data lines of one of the light-emitting components are located between the two light-emitting units of the one of the light-emitting components.

Alternatively, in some embodiments of the present application, the first direction is perpendicular to the second direction.

Alternatively, in some embodiments of the present application, the first direction is a column direction and the second direction is a row direction.

Alternatively, in some embodiments of the present application, each of the light-emitting pixels comprises three of the sub light-emitting pixels, at least part of the light-emitting pixels is electrically connected with two of the scanning lines, and each of the sub light-emitting pixels in the part of the light-emitting pixels is electrically connected with one of the two of the scanning lines.

Alternatively, in some embodiments of the present application, any one of the light-emitting pixels is electrically connected with two of the scanning lines.

Alternatively, in some embodiments of the present application, each of the scanning lines is arranged between adjacent two of the sub light-emitting pixels in the light-emitting pixels.

Alternatively, in some embodiments of the present application, part of the light-emitting pixels is electrically connected with the two of the scanning lines, and part of the light-emitting pixels is electrically connected with three of the scanning lines.

Alternatively, in some embodiments of the present application, the substrate is further disposed with a plurality of control switches, and a number of the plurality of control switches is equal to the number of the plurality of sub light-emitting pixels; the sub light-emitting pixels are electrically connected with the control switches in a one-to-one correspondence, and the control switches are electrically connected with the scanning lines and the data lines.

Alternatively, in some embodiments of the present application, the plurality of scanning lines and the plurality of data lines form a plurality of cross areas, a number of the plurality of the cross areas is equal to the number of the control switches, and each of the cross areas is disposed with one of the control switches.

Alternatively, in some embodiments of the present application, each of the control switches is located at a position near a correspondingly connected one of the sub light-emitting pixels in the cross areas.

Alternatively, in some embodiments of the present application, each of the control switches comprises a gate electrode, a source electrode, and a drain electrode, the gate electrode is electrically connected with one of the scanning lines, the source electrode is electrically connected with one of the data lines, and the drain electrode is electrically connected with one of the sub light-emitting pixels.

Alternatively, in some embodiments of the present application, each of the control switches comprises a gate electrode, a source electrode, and a drain electrode; the gate electrode is electrically connected with one of the scanning lines, the drain electrode is electrically connected with one of the data lines, and the source electrode is electrically connected with one of the sub light-emitting pixels.

Alternatively, in some embodiments of the present application, the gate electrode is arranged on a same layer as the scanning lines.

Alternatively, in some embodiments of the present application, the source electrode and the drain electrode are arranged on a same layer as the data lines.

In the embodiments of the present application, the display panel comprises a substrate, and the substrate is disposed with a plurality of scanning lines and a plurality of data lines. the plurality of scanning lines extend along a first direction and are arranged in parallel along a second direction. the plurality of data lines extend along the second direction and are arranged in parallel along the first direction, and the first direction is at an comprised angle with the second direction. A plurality of the light-emitting components are arranged on the substrate in parallel along the second direction, each of the light-emitting components comprises three of the data lines and two light-emitting units arranged in parallel along the first direction. Each of the light-emitting units comprises a plurality of light-emitting pixels arranged in parallel along the second direction, and each of the light-emitting pixels comprises a plurality of sub light-emitting pixels arranged in parallel along the second direction. A number of the scanning lines is less than a number of the sub light-emitting pixels in one of the light-emitting units. A product of the number of the data lines and a number of the scanning lines is greater than or equal to a number of the sub light-emitting pixels. In the present application, In the present application, by electrically connecting two light-emitting units with three data lines, the number of the data lines can be increased, the load of each data line can be reduced, and the large light-emitting difference between the sub light-emitting pixels connected on one data line can be avoided, so as to improve the overall light-emitting effect of the display panel.

BRIEF DESCRIPTION OF DRAWINGS

In order to explain the technical solutions in the embodiments of the present application more clearly, the following will briefly introduce the drawings needed in the description of the embodiments. Obviously, the drawings in the following description are only some embodiments of the present application. For those skilled in the art, other drawings can be obtained based on these drawings without creative work.

DESCRIPTION OF REFERENCE MARKS

Figure 1:
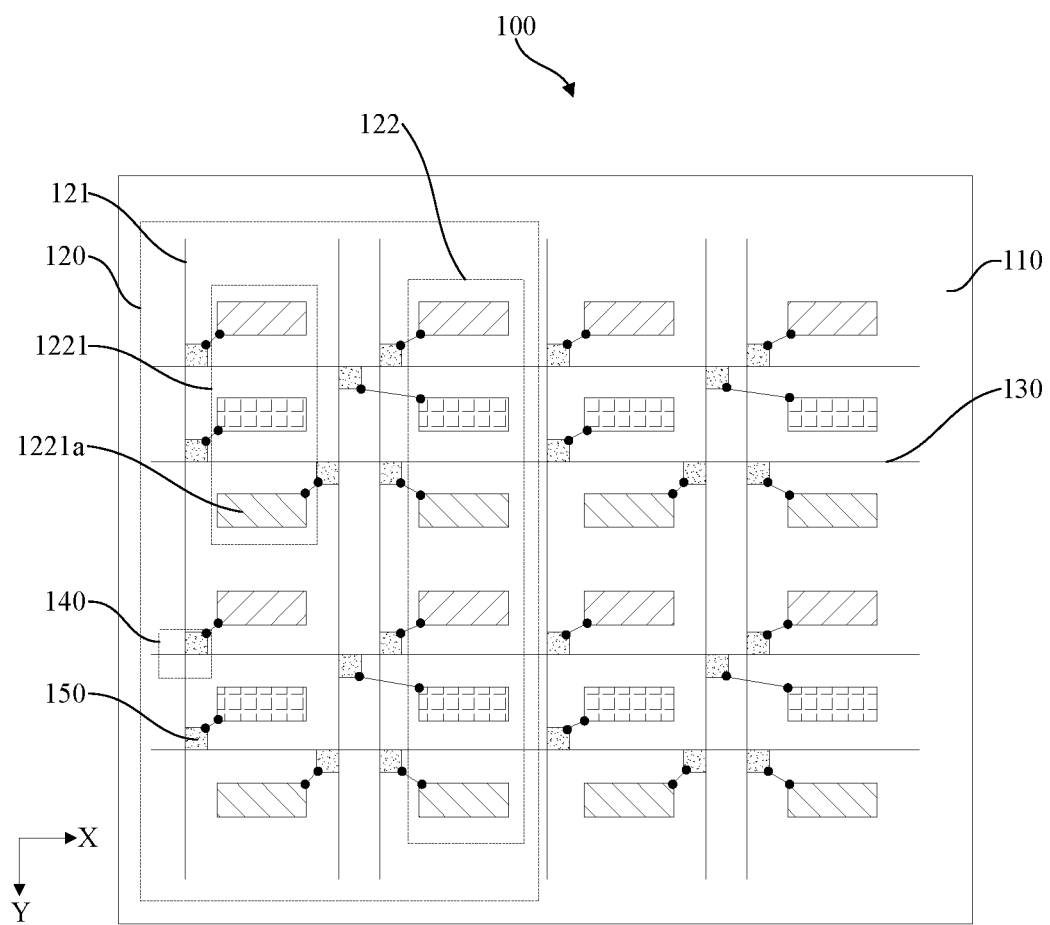
FIG. 1 is a schematic diagram of a pixel architecture of a display panel provided by embodiments of the present application.
Figure 2:
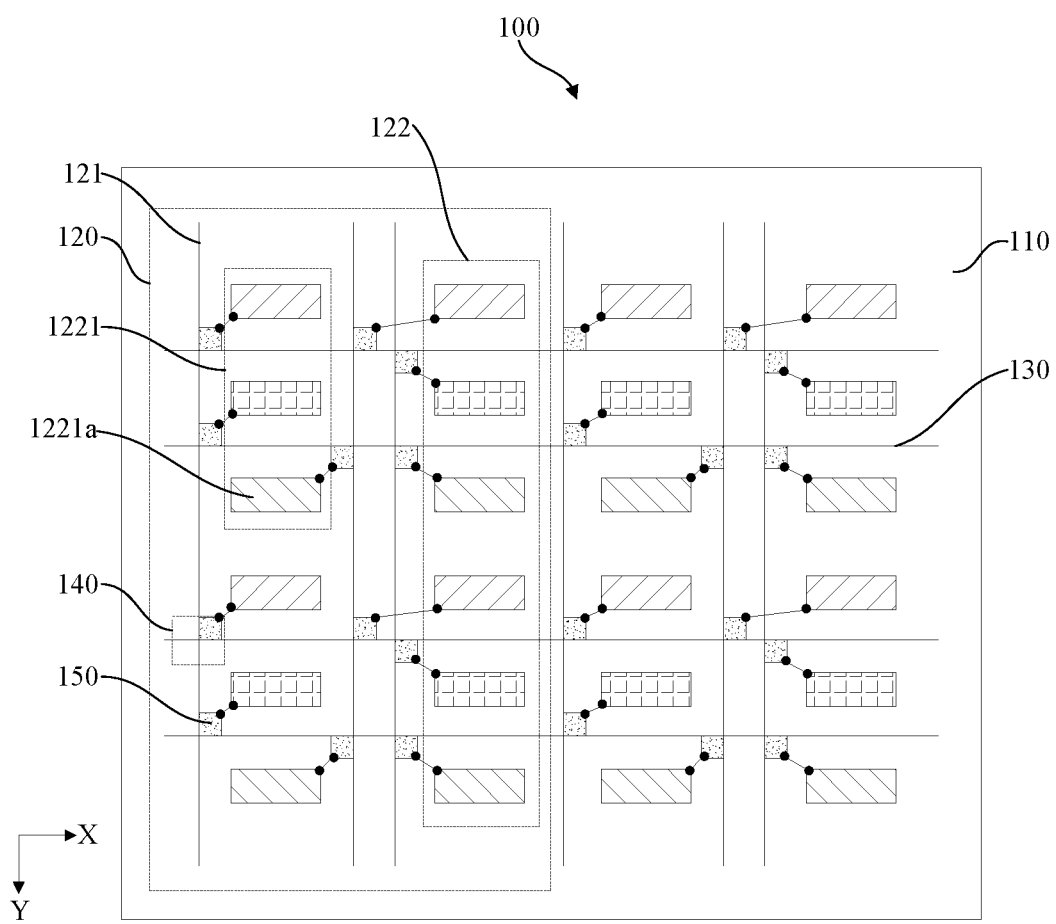
FIG. 2 is a schematic diagram of a pixel architecture of another display panel provided by the embodiments of the present application.
Figure 3:
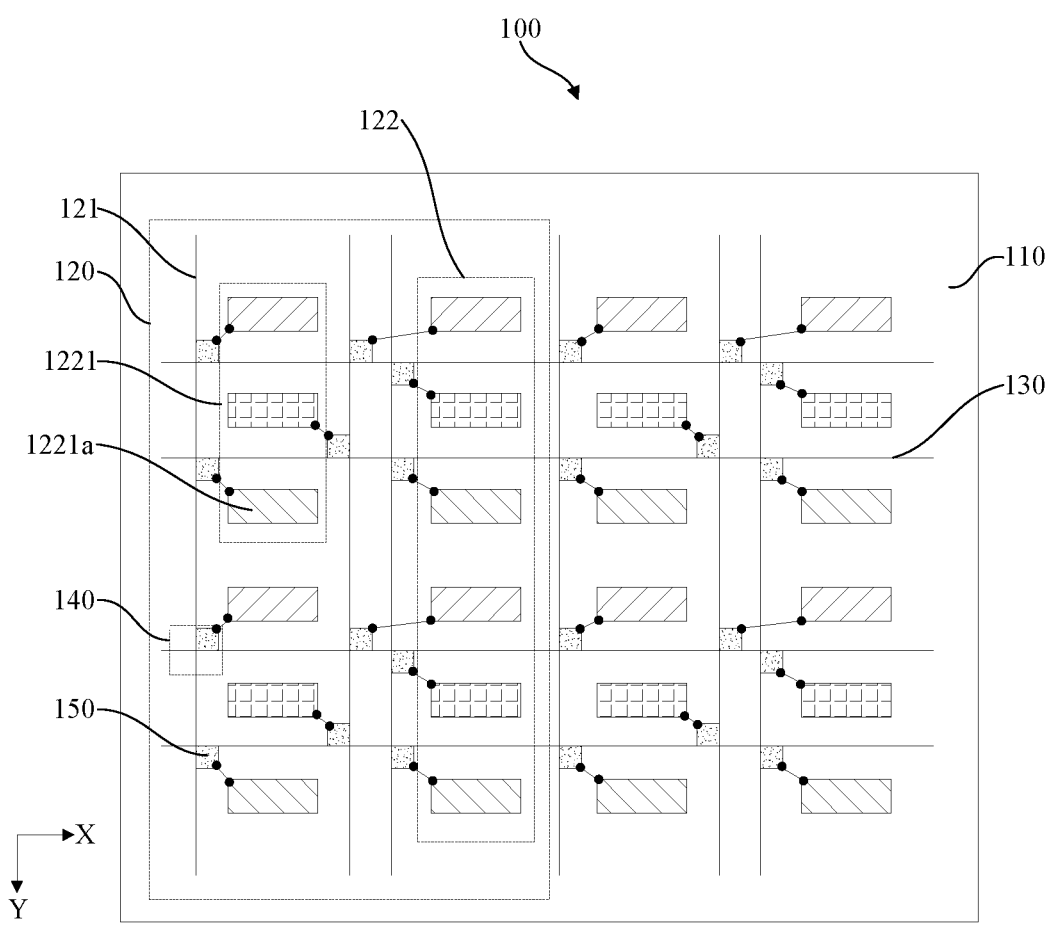
FIG. 3 is a schematic diagram of a pixel architecture of another display panel provided by the embodiments of the present application.
Figure 4:
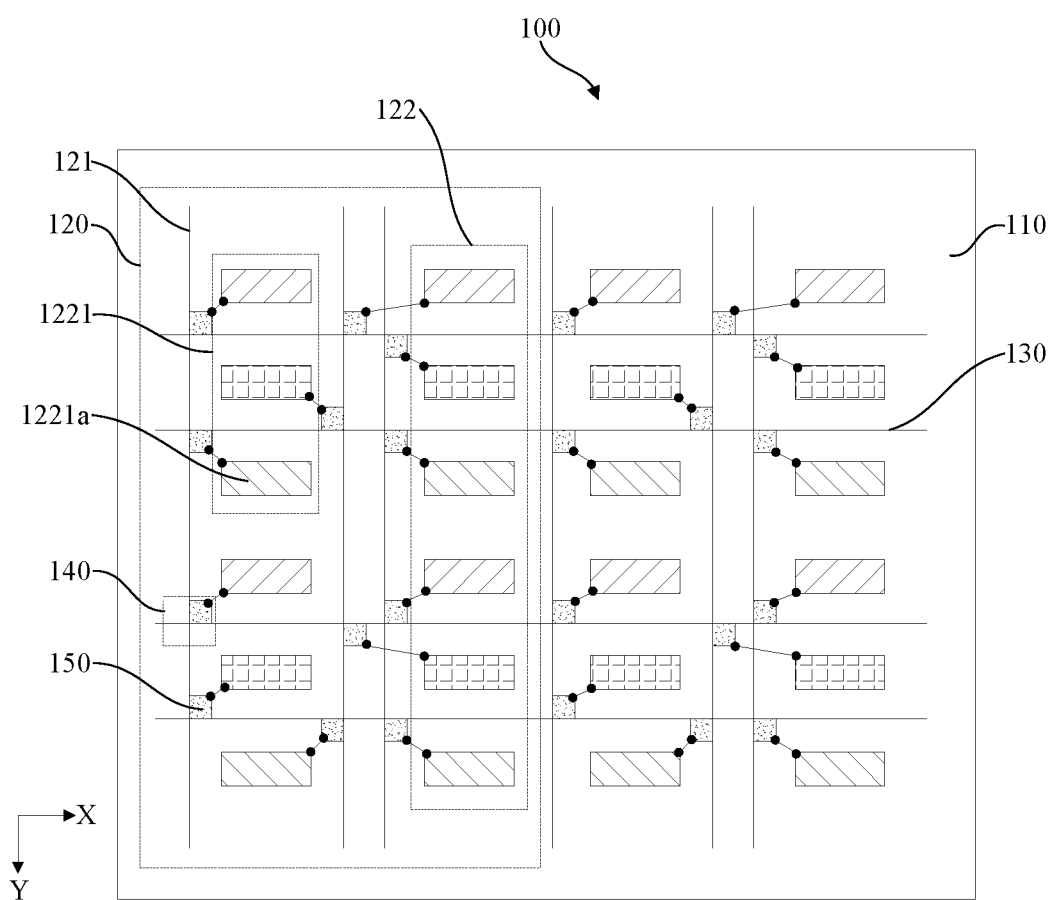
FIG. 4 is a schematic diagram of a pixel architecture of another display panel provided by the embodiments of the present application.
Figure 5:
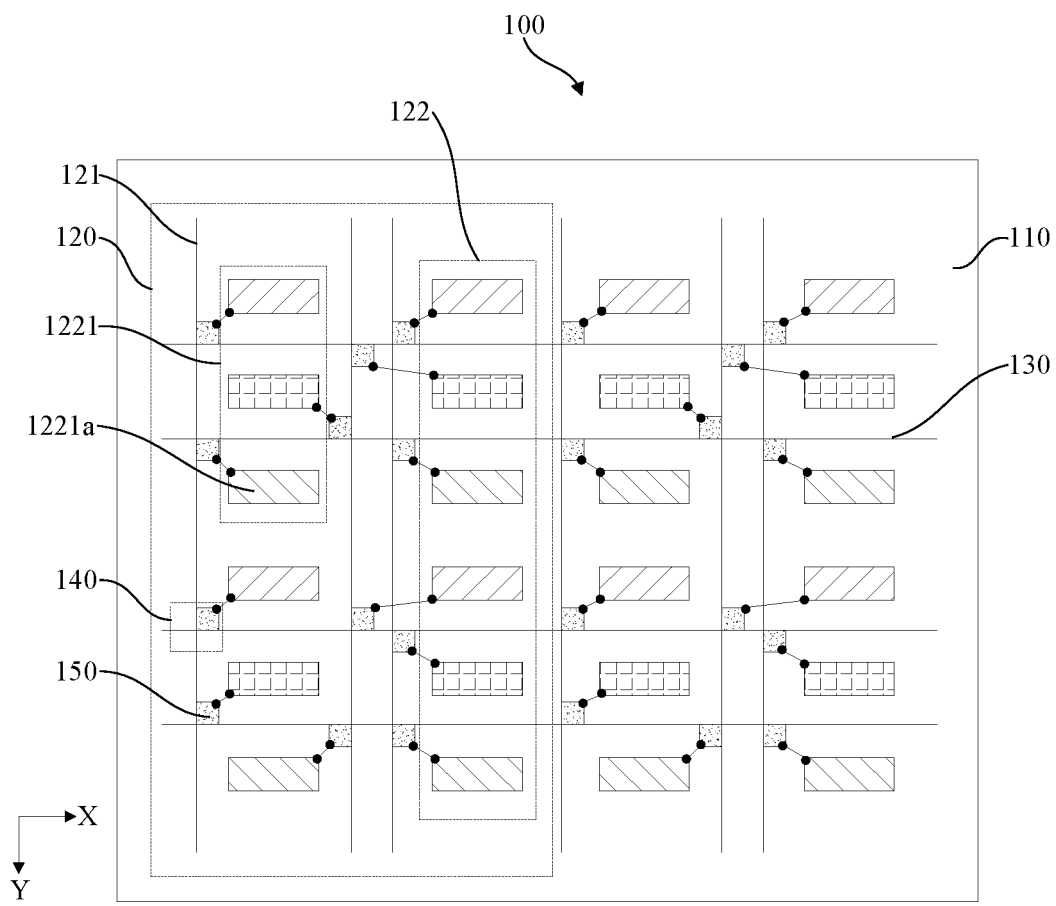
FIG. 5 is a schematic diagram of a pixel architecture of another display panel provided by the embodiments of the present application.

| reference mark | part name | reference mark | part name |
|---|---|---|---|
| 10 | display device | 130 | scanning line |
| 100 | display panel | 140 | cross area |
| 110 | substrate | 150 | control switch |
| 120 | light-emitting component | X | first direction |
| 121 | data line | Y | second direction |
| 122 | light-emitting unit | 200 | control circuit |
| 1221 | light-emitting pixel | 300 | housing |
| 1221a | sub light-emitting pixel | | |

DETAILED DESCRIPTION OF PREFERRED EMBODIMENTS

In the following, the technical scheme in the embodiment of the present application will be described clearly and completely in combination with the drawings. Obviously, the described embodiments are only a part of the embodiments of the present application, rather than all the embodiments. Based on the embodiments of the present application, all other embodiments obtained by those skilled in the art without creative work fall within the protection scope of the present application. In addition, it should be understood that the specific embodiments described herein are only used to explain the present application and are not used to limit the present application. In the present application, in the absence of a contrary explanation, the location words used, such as "up" and "down", usually refer to the up and down under the actual use or working state of the device, specifically the drawing direction in the attached drawings. The "inside" and "outside" are for the contour of the device.

The embodiments of the present application provide a display panel and a display device. The following are described in detail. It should be noted that an order of description of the following embodiments is not a limitation of the preferred order of the embodiments.

First, the embodiments of the present application provide a display panel. As shown in FIG. 1, the display panel 100 comprises a substrate 110. The substrate 110 is used as a bearing structure of the display panel 100 to support other functional film layers in the display panel 100 to ensure structural stability of the display panel 100.

The substrate 110 is disposed with a plurality of scanning lines 130 and a plurality of data lines 121. The plurality of scanning lines 130 extend along a first direction X and are arranged in parallel along a second direction Y. The plurality of data lines 121 extend along the second direction Y and are arranged in parallel along the first direction X, and the first direction X is at an included angle with the second direction Y, that is, the plurality of scanning lines 130 and the plurality of data lines 121 are crossedly arranged on the substrate 110 in a distribution direction.

Among them, the first direction X can be defined as a column direction, and the second direction Y can be defined as a row direction, and the first direction X is perpendicular to the second direction Y. That is, the plurality of scanning lines 130 are distributed as multiple rows and the plurality of data lines 121 are distributed in multiple columns. Hence, the scanning lines 130 and the data lines 121 are distributed in multiple rows and multiple columns, so as to facilitate connection designs between subsequent structures and the scanning lines 130 and the data lines 121.

It should be noted that in the embodiments of the present application, the scanning lines 130 and the data lines 121 are located on different film layers of the display panel 100, and "crossedly arranged in the distribution direction" refers to a spatial cross, not a direct cross connection, so as to ensure that no electrical crosstalk occurs between the scanning lines 130 and the data lines 121.

The display panel 100 comprises a plurality of light-emitting components 120. The light-emitting components 120 are arranged on the substrate 110 in parallel along the first direction X, that is, a distribution direction of the light-emitting components 120 is consistent with the distribution direction of the data lines 121. Each of the light-emitting components 120 comprises three data lines 121 and two light-emitting units 122 arranged in parallel along the first direction X, that is, a light-emitting component 120 comprises three data lines 121 and two light-emitting units 122 distributed in columns. A position of the data lines 121 in one light-emitting component 120 relative to the light-emitting units 122 can be adjusted accordingly according to design requirements.

Each of the light-emitting units 122 comprises a plurality of light-emitting pixels 1221 arranged in parallel along the second direction Y. And each of the light-emitting pixels 1221 comprises a plurality of sub light-emitting pixels 1221a arranged in parallel along the second direction Y, that is, a distribution direction of the light-emitting pixels 1221 and a distribution direction of the sub light-emitting pixels 1221a in one light-emitting unit 122 are consistent with a distribution direction of the scanning lines 130. That is, one light-emitting component 120 comprises three data lines 121 and two columns of multi-row sub light-emitting pixels 1221a.

Each of the sub light-emitting pixels 1221A in one of the light-emitting components 120 is electrically connected with one of the data lines 121 in the one of the light-emitting components 120. By adjusting distribution modes of the three data lines 121 in the one of the light-emitting component 120, connection modes between the sub light-emitting pixels 1221a and the data lines 121 can be designed to prevent mutual interference between the plurality of sub light-emitting pixels 1221a while ensuring that the plurality of sub light-emitting pixels 1221a can all be electrically connected with one of the data lines 121.

It should be noted that when each of the sub light-emitting pixels 1221a is electrically connected with one data line 121, the sub light-emitting pixel 1221a also need to be electrically connected with one scanning line 130 at a same time to realize a regulation of the light-emitting condition of the sub light-emitting pixel 1221a. By adjusting the distribution modes of the scanning lines 130 and the data lines 121, a regulation of the connection modes of the sub light-emitting pixels 1221a can be realized.

Alternatively, a number of the scanning lines 130 is less than a number of the sub light-emitting pixels 1221a in one of the light-emitting units 122, that is, the number of the scanning lines 130 is less than a number of rows of the sub light-emitting pixels 1221a. In the embodiments of the present application, one light-emitting component 120 comprises two light-emitting units 122 and three data lines 121. Compared with a conventional method of each light-emitting unit 122 corresponding to one data line 121, a layout number of the data lines 121 is increased, so that a number of the sub light-emitting pixels 1221a connected to each data line 121 can be reduced accordingly, so as to reduce the load on each data line 121 and prevent a large light-emitting difference between the sub light-emitting pixels 1221a due to an excessive load when a signal is input on the data line 121, thereby affecting an overall display effect of the display panel 100.

Wherein a product of the scanning lines 130 and the data lines 121 in one of the light-emitting components 120 is greater than or equal to a number of the sub light-emitting pixels 1221a in the one of the light-emitting components 120. In an actual design process, each sub light-emitting pixel 1221a needs to be electrically connected with a scanning line 130 and a data line 121, and only one sub light-emitting pixel 1221a is connected with a same scanning line 130 and a same data line 121 at a same time, so as to realize an independent control of each sub light-emitting pixel 1221a. However, a plurality of sub light-emitting pixels 1221a can be connected to one scanning line 130 at a same time, and a plurality of sub light-emitting pixels 1221a can also be connected to one data line 121 at a same time, so as to reduce distribution numbers of the scanning lines 130 and the data lines 121 and simplify the distribution modes. By arranging the product of the scanning lines 130 and the data lines 121 in one of the light-emitting components 120 to be greater than or equal to the number of the sub light-emitting pixels 1221a in the one of the light-emitting components 120, it can be ensured that each sub light-emitting pixel 1221a in the one of the light-emitting components 120 can be electrically connected with the scanning line 130 and the data line 121.

In the embodiments of the present application, the distribution direction of the sub light-emitting pixels 1221a of the light-emitting units 122 is consistent with the distribution direction of the scanning lines 130, and the two light-emitting units 122 and the three data lines 121 form a light-emitting component 120, so that the sub light-emitting pixels 1221a in the light-emitting component 120 are respectively connected with one of the three data lines 121, and the number of the scanning lines 130 is less than the number of the sub light-emitting pixels 1221a of the light-emitting units 122. Hence, compared with the traditional structure in which distribution modes of the scanning lines 130 and the data lines 121 are consistent with a distribution mode of the sub light-emitting pixels 1221a, this structural design can increase the number of the data lines 121, reduce the load on each data line 121, prevent the large light-emitting difference between the sub light-emitting pixels 1221a connected on one data line 121, and improve the overall display effect of the display panel 100.

Figure 6:
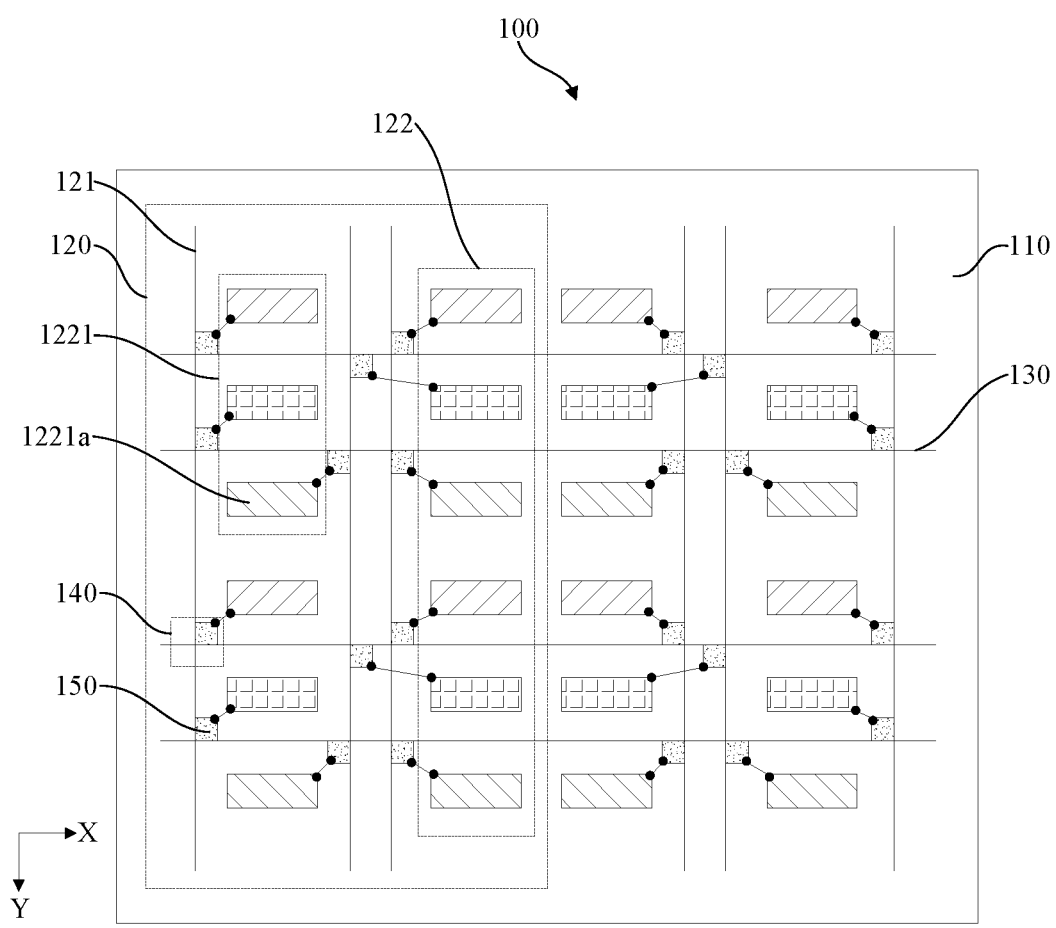
FIG. 6 is a schematic diagram of a pixel architecture of another display panel provided by the embodiments of the present application.

Alternatively, as shown in FIGS. 1 and 6, two data lines 121 of the light-emitting component 120 are arranged between the two light-emitting units 122 of the light-emitting component 120. Since the number of the scanning lines 130 is less than the number of the sub light-emitting pixels 1221a of one of the light-emitting units 122, that is, the number of the scanning lines 130 is less than the number of rows of the sub light-emitting pixels 1221a, one data line 121 cannot connect a whole column of the sub light-emitting pixels 1221a at a same time. Arranging two of the three data lines 121 of the light-emitting component 120 between the two light-emitting units 122 is conducive to electrical connection between the light-emitting unit 122 and the adjacent scanning lines 130, so as to prevent mutual crosstalk in a connection process caused by a long distance between the data lines 121 and the sub light-emitting pixels 1221a in the light-emitting units 122, which affects the regulation of the light-emitting condition of each sub light-emitting pixel 1221a.

One of the light-emitting units 122 of the light-emitting component 120 is arranged between two data lines 121 of the light-emitting component 120, that is, the light-emitting component 120 has opposite sides in the first direction X, and a remaining data line 121 in the light-emitting component 120 is arranged on one side edge of the light-emitting component 120 so that one of the two light-emitting units 122 is located between the two data lines 121. The remaining data line 121 is used to electrically connect with the sub light-emitting pixels 1221a in an adjacent light-emitting unit 122, so as to save a use of two data lines 121 between the two light-emitting units 122, and prevent that the sub light-emitting pixel 1221a far away from the data line 121 located on the one side edge of the light-emitting component 120 needs to be connected across pixels, thereby preventing mutual crosstalk between the sub light-emitting pixels 1221a.

Alternatively, in the first direction X, two data lines 121 and one data line 121 are alternately arranged between two adjacent light-emitting units 122 in turn. That is, if the plurality of light-emitting components 120 are regarded as a whole, one side edge of the whole in the first direction X is disposed with a data line 121. According to a direction indicated by an arrow in the first direction X in FIGS. 1 to 5, the two data lines 121 and the one data line 121 are alternately arranged between the two adjacent light-emitting units 122 in turn.

That is, the two data lines 121 are arranged between the light-emitting unit 122 in a first column and the light-emitting unit 122 in a second column, and the one data line 121 is arranged between the light-emitting unit 122 in the second column and the light-emitting unit 122 in a third column; the two data lines 121 are arranged between the light-emitting unit 122 in the third column and the light-emitting unit 122 in a fourth column, and so on. In addition, a data line 121 is arranged on a side of the first column of the light-emitting units 122 away from the second column of the light-emitting units 122, or a data line 121 is arranged on a side of a last column of the light-emitting units 122 away from a penultimate column of the light-emitting units 122. This structural design makes the plurality of data lines 121 on the substrate 110 distribute regularly as a whole, which is helpful to an overall structural design of the display panel 100 and improve production efficiency.

Figure 7:
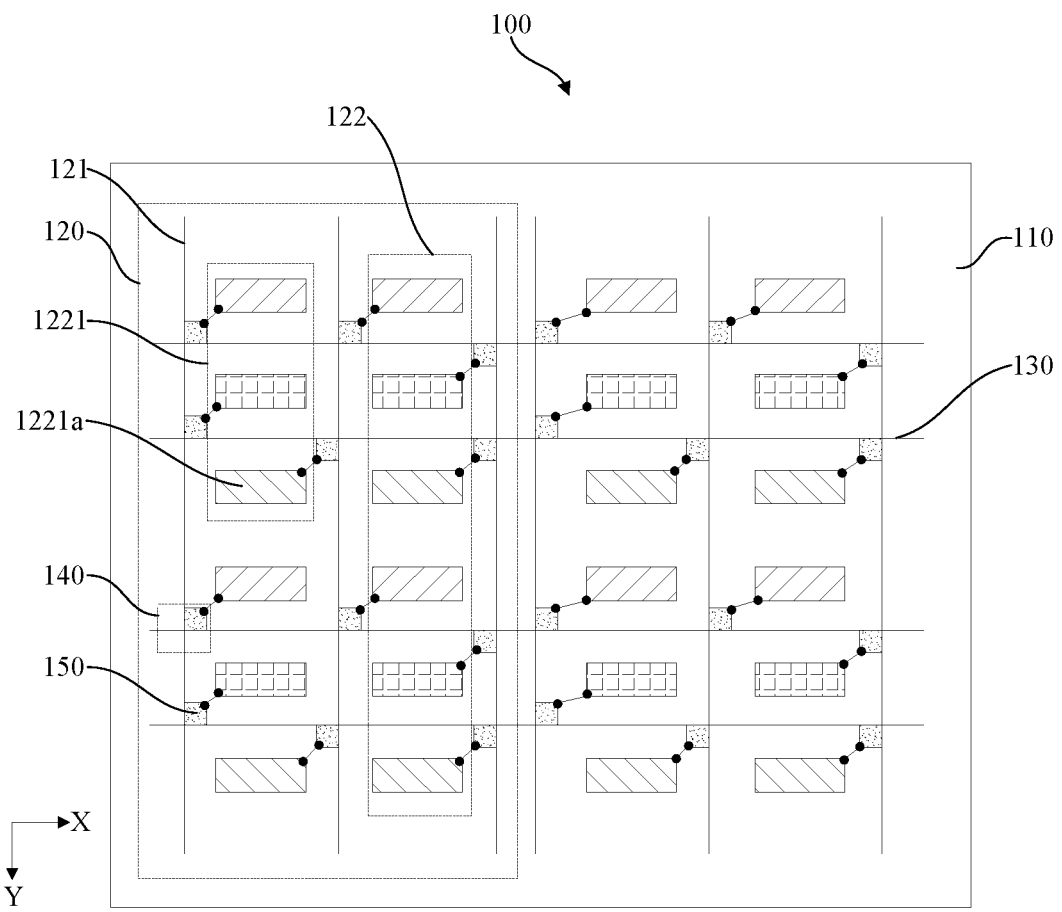
FIG. 7 is a schematic diagram of a pixel architecture of another display panel provided by the embodiments of the present application.

Alternatively, as shown in FIG. 7, in the embodiments of the present application, two light-emitting units 122 of at least part of the light-emitting components 120 are respectively arranged between the two data lines 121 of the part of the light-emitting components 120. That is, for the part of the light-emitting components 120, the data lines 121 and the light-emitting units 122 are arranged alternately, so that the two light-emitting units 122 are respectively sandwiched between the two data lines 121. This structural design can reduce the data lines 121 arranged between the two light-emitting units 122 of a single light-emitting component 120, so that each sub light-emitting pixel 1221a can be electrically connected with its adjacent data line 121 directly, so as to reduce a risk of the mutual crosstalk between the sub light-emitting pixels 1221a.

In some embodiments, one data line 121 and two data lines 121 are alternately arranged between two adjacent light-emitting units 122 in turn in the first direction X. That is, if the plurality of light-emitting components 120 are regarded as a whole, a data line 121 is arranged on opposite edges of the whole in the first direction X, respectively. According to a direction indicated by an arrow in the first direction X in FIG. 7, the one data line 121 and the two data lines 121 are alternately arranged between the two adjacent light-emitting units 122 in turn.

That is, the one data line 121 is arranged between the light-emitting unit 122 in the first column and the light-emitting unit 122 in the second column, and the two data lines 121 are arranged between the light-emitting unit 122 in the second column and the light-emitting unit 122 in the third column; the one data line 121 is arranged between the light-emitting unit 122 in the third column and the light-emitting unit 122 in the fourth column, and so on. In addition, a data line 121 is arranged on the side of the first column of the light-emitting units 122 away from the second column of the light-emitting units 122 and the side of the last column of light-emitting units 122 away from the penultimate column of light-emitting units 122, respectively.

This structural design enables the sub light-emitting pixels 1221a in each light-emitting unit 122 to be electrically connected with the adjacent data line 121 directly without connecting cross pixels or cross data lines 121, so as to further reduce the risk of mutual crosstalk between the sub light-emitting pixels 1221a.

Alternatively, in the embodiments of the present application, the distribution modes of the three data lines 121 in the plurality of light-emitting components 120 are same. That is, the connection modes between the sub light-emitting pixels 1221a of each light-emitting component 120 and the corresponding data lines 121 are same. Hence, an overall connection mode of the plurality of light-emitting components 120 is in regular distribution, which is helpful to simplify a design of the pixel structure in the display panel 100, reduce production difficulty, and improve the production efficiency.

In some embodiments, the distribution modes of the three data lines 121 in the plurality of light-emitting components 120 can also be different, or a form of alternating design of multiple distribution modes in the above embodiments can be adopted, and its specific structure can be adjusted accordingly according to actual production requirements. There is no special restriction here, but only to ensure an effective regulation of the light-emitting mode of the plurality of sub light-emitting pixels 1221a in the display panel 100.

It should be noted that in the embodiments of the present application, the three data lines 121 of the light-emitting component 120 can all be located between the two light-emitting units 122 of the light-emitting component 120. Part of the sub light-emitting pixels 1221*a* in the two light-emitting units 122 are electrically connected with the adjacent data lines 121 directly, and part of the sub light-emitting pixels 1221*a* are electrically connected with a middle one of the three data lines 121. This structural design makes the distribution of the data lines 121 on the substrate 110 relatively concentrated and relatively less affected by the distribution mode of the sub light-emitting pixels 1221*a*, which is conducive to improving flexibility of the connection mode between the sub light-emitting pixels 1221*a* and the data lines 121.

Alternatively, in the embodiments of the present application, the light-emitting pixel 1221 comprises three sub light-emitting pixels 1221*a*, at least part of the light-emitting pixels 1221 is electrically connected with two scanning lines 130, and the sub light-emitting pixels 1221*a* in the light-emitting pixels 1221 are electrically connected with one of the scanning lines 130, respectively. As shown in FIGS. 1 to 7, taking multiple columns of three-row sub light-emitting pixels 1221*a* as a unit, the three-row sub light-emitting pixels 1221*a* can be electrically connected with only two scanning lines 130. Compared with a tradition which three rows of the sub light-emitting pixels 1221*a* need to be connected with three scanning lines 130, it can reduce a distribution amount of the scanning lines 130 and increase a distribution amount of the data line 121, so as to reduce the load on each data line 121, prevent the large light-emitting difference between the sub light-emitting pixels 1221*a* connected on one data line 121, and improve an overall light-emitting effect of the display panel 100.

In some embodiments, any one light-emitting pixels 1221 is electrically connected with two scanning lines 130. According to a direction indicated by an arrow in the second direction Yin FIG. 1, every three rows are divided into a group, and each group is disposed with two scanning lines 130. Compared with a traditional distribution mode of the scanning lines 130, one scanning line 130 can be reduced in each group. Hence, the load on each data line 121 is further reduced and the overall light-emitting effect of the display panel 100 is improved.

It should be noted that according to the different distribution modes of the data lines 121, part of the light-emitting pixels 1221 can be electrically connected with the two scanning lines 130, and part of the light-emitting pixels 1221 still retains the traditional setting mode of electrically connecting with the three scanning lines 130. This setting mode can increase selectivity of the connection mode between the sub light-emitting pixels 1221*a* and the scanning lines 130 and the data lines 121 and reduce the risk of mutual crosstalk between the sub light-emitting pixels 1221*a* due to line designs.

Alternatively, when one light-emitting pixel 1221 is electrically connected with two scanning lines 130, the scanning lines 130 can be arranged between two adjacent sub light-emitting pixels 1221*a* in the light-emitting pixels 1221, so that each sub light-emitting pixel 1221*a* can be electrically connected with the adjacent scanning line 130, so as to prevent cross pixel connection and reduce the risk of mutual crosstalk between the sub light-emitting pixels 1221*a*.

When each light-emitting pixel 1221 is electrically connected to only two scanning lines 130, and the scanning lines 130 are arranged between two adjacent sub light-emitting pixels 1221*a* in the light-emitting pixel 1221, in the second direction Y, it is equivalent to that no scanning line 130 is arranged between the two adjacent light-emitting pixels 1221. Hence, connections between each row of the light-emitting pixels 1221 and the scanning lines 130 are independent of each other, which is helpful to simplify an overall layout design of the connection modes between the sub light-emitting pixels 1221*a* and the scanning lines 130.

Wherein, each light-emitting pixel 1221 comprises three sub light-emitting pixels 1221*a*, which are red pixels, green pixels, and blue pixels respectively. In the embodiments of the present application, in the second direction Y, the light-emitting pixel 1221 comprises red pixels, green pixels, and blue pixels arranged in sequence. In the first direction X, the sub light-emitting pixels 1221*a* in a same row are pixels of a same color, so that when the sub light-emitting pixels 1221*a* are produced by a printing process, the printing can be carried out row by row, so as to improve printing efficiency.

It should be noted that in the second direction Y, a color order of the three sub light-emitting pixels 1221*a* in the light-emitting pixel 1221 can be adjusted accordingly according to design requirements, as long as colors of the sub light-emitting pixels 1221*a* located in a same row along the first direction X are same, and there is no special restriction here.

It can be understood that the connection modes of the plurality of sub light-emitting pixels 1221*a* in each light-emitting component 120 with the scanning lines 130 and the data lines 121 are diverse, and specific connection modes can be adjusted accordingly according to an actual design situation. Changes made only to the connection modes are within the protection scope of the embodiments of the present application. Several of these connection modes will be described in detail below.

As shown in FIG. 1, in a light-emitting component 120, a first data line 121 is arranged on one side of the first column of the light-emitting pixels 1221, and a second data line 121 and a third data line 121 are arranged between two columns of the light-emitting pixels 1221. Each light-emitting pixel 1221 comprises three sub light-emitting pixels 1221*a*, the scanning lines 130 is successively arranged between the two adjacent sub light-emitting pixels 1221*a* in the light-emitting pixels 1221, and the scanning lines 130 is not arranged between the two adjacent light-emitting pixels 1221. Three columns of the scanning lines 130 and two rows of the data lines 121 can be electrically connected with six sub light-emitting pixels 1221*a* in one light-emitting component.

Wherein, any two sub light-emitting pixels 1221*a* of each light-emitting pixel 1221 in the first column are electrically connected with the first data line 121. Any two sub light-emitting pixels 1221*a* of each light-emitting pixel 1221 in the second column are electrically connected with the third data line 121. Remaining sub light-emitting pixels 1221*a* in the first column and the second column are electrically connected with the second data line 121. Meanwhile, the sub light-emitting pixels 1221*a* in the first row are electrically connected with the first scanning line 130. The sub light-emitting pixels 1221*a* in the third row are electrically connected with the second scanning line 130. And half of the sub light-emitting pixels 1221*a* of the second row are electrically connected with the first scanning line 130 and another half of the sub light-emitting pixels 1221*a* of the second row are electrically connected with the second scanning line 130. This setting method can not only ensure full utilization of the scanning lines 130 and the data lines 121, but also prevent the mutual crosstalk between the sub light-emitting pixels 1221*a*.

As shown in FIG. 7, in one light-emitting component 120, the first data line 121 is arranged on one side of the first column of the light-emitting pixels 1221. The second data line 121 is arranged between two columns of the light-emitting pixels 1221. The third data line 121 is arranged on another side of the second column of the light-emitting pixels 1221. The scanning line 130 is successively arranged between the two adjacent sub-light-emitting pixels 1221a in the light-emitting pixels 1221, and the scanning line 130 is not arranged between the two adjacent light-emitting pixels 1221.

Wherein, connection rules between each sub light-emitting pixel 1221a and the scanning line 130 and the data line 121 are consistent with connection rules in FIG. 1 above, which will not be repeated here. This setting mode enables the sub light-emitting pixels 1221a of each row to be electrically connected with the adjacent data lines 121 directly without connecting across the data lines 121, which can further reduce the risk of mutual crosstalk between the sub light-emitting pixels 1221a.

Alternatively, the substrate 110 is further disposed with a plurality of control switches 150. A number of the plurality of control switches 150 is equal to a number of the plurality of sub light-emitting pixels 1221a. The sub light-emitting pixels 1221a are connected with the control switches 150 in a one-to-one correspondence, and each of the control switches 150 is electrically connected with the scanning line 130 and the data line 121, so as to realize electrical connections of the sub light-emitting pixels 1221a with the scanning lines 130 and the data lines 121.

The control switch 150 is used to electrically connect the sub light-emitting pixel 1221a with the scanning line 130 and the data line 121, so that on and off of the corresponding control switch 150 can be controlled by changing input signals on the scanning line 130 and the data line 121, so as to control light emission of the corresponding sub light-emitting pixel 1221a. In addition, through a design of connection modes between the control switch 150 and the scanning line 130 and the data line 121, the light emission of the sub light-emitting pixel 1221a can also be controlled.

Alternatively, the plurality of scanning lines 130 and the plurality of data lines 121 on the substrate 110 form a plurality of cross areas 140. Each cross area 140 can be used as a connection point between the sub light-emitting pixel 1221a and the scanning line 130 and the data line 121. An arranging position of the control switch 150 can be adjusted according to a position of the cross area 140 to facilitate the electrical connection between the sub light-emitting pixel 1221a and the scanning line 130 and the data line 121.

A number of the plurality of cross areas 140 is equal to the number of the plurality of control switches 150, and the control switches 150 are arranged in each cross area 140, so that the plurality of sub light-emitting pixels 1221a correspond to the plurality of cross areas 140 in the one-to-one correspondence, that is, the product of the number of the plurality of scanning lines 130 and the number of plurality of the data lines 121 is equal to the number of the plurality of sub light-emitting pixels 1221a, so that a utilization rate of the scanning lines 130 and the data lines 121 reaches a maximum.

It should be noted that a position of the control switch 150 in the cross area 140 can be adjusted according to a position of the corresponding sub light-emitting pixel 1221a connected thereto, so that the control switch 150 is located at a position close to the corresponding sub light-emitting pixel 1221a connected thereto in the cross area 140, so as to shorten wiring between the sub light-emitting pixel 1221a and the corresponding control switch 150, reduce the risk of crosstalk between the sub light-emitting pixels 1221a, and reduce production cost.

Alternatively, in the embodiments of the present application, each of the control switch 150 comprises a gate electrode, a source electrode, and a drain electrode. The gate electrode is used for electrical connection with one of the scanning lines 130, the source electrode is used for electrical connection with one of the data lines 121, and the drain electrode is used for electrical connection with one of the sub light-emitting pixels 1221a. Through a regulation of a scanning signal on the scanning line 130 and a data signal on the data line 121, conduction or disconnection between the source electrode and the drain electrode can be controlled, so as to control whether the sub light-emitting pixel 1221a emits light or not, so as to realize a regulation of the overall light-emitting effect of the display panel 100.

In some embodiments, the drain electrode of the control switch 150 is used for electrical connection with one of the data line 121, and the source electrode is used for electrical connection with one of the sub light-emitting pixel 1221a. The specific connection mode is related to a type and a line design mode of the control switch 150, which can be adjusted accordingly according to the specific situation, and there are no special restrictions here.

The gate electrode of the control switch 150 can be arranged on a same layer as the scanning lines 130 to reduce a number of film layers of the display panel 100 and reduce an overall thickness of the display panel 100. At a same time, a routing number between the gate electrode and the corresponding scanning line 130 can also be reduced and the production cost can be reduced.

In some embodiments, the gate electrode of the control switch 150 and the scanning line 130 are located in different film layers, the gate electrode and the scanning line 130 are separated by an insulating layer, and then a via is provided at a corresponding position on the insulating layer to realize an electrical connection between the gate electrode and the corresponding scanning line 130. This structural design can reduce the risk of mutual crosstalk between the control switches 150 and ensure the display effect of the display panel 100.

Similarly, the source electrode and the drain electrode of the control switch 150 can also be arranged on a same film layer or on different film layers with the data lines 121. The specific setting mode can be adjusted according to an actual design situation, and there is no special restriction here.

Secondly, the embodiments of the present application also provide a display device. The display device comprises a display panel. For a specific structure of the display panel, please refer to the above embodiments. Since the display device adopts all technical solutions of all the above embodiments, it has at least all beneficial effects brought by the technical solutions of the above embodiments, which will not be repeated here.

Figure 8:
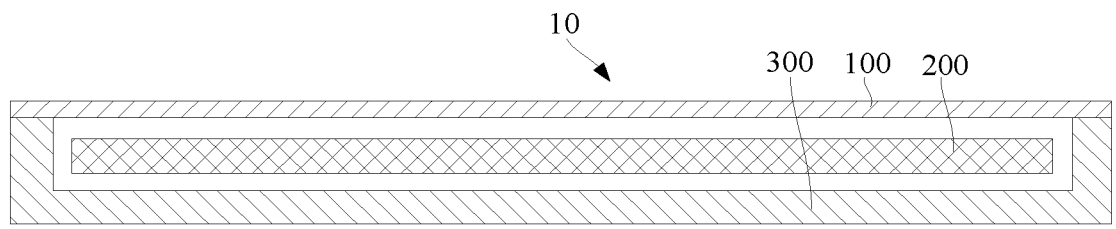
FIG. 8 is a schematic diagram of a display device provided by the embodiments of the present application.

As shown in FIG. 8, the display device 10 comprises a display panel 100, a control circuit 200, and a housing 300. The housing 300 is connected with the display panel 100 to support and fix the display panel 100. The control circuit 200 is arranged in the housing 300, and the control circuit 200 is electrically connected with the display panel 100 to control the display panel 100 to perform screen display.

The display panel 100 can be fixed to the housing 300 to form a whole with the housing 300, and the display panel 100 and the housing 300 form a closed space to accommodate the control circuit 200. The control circuit 200 can be a main board of the display device 10. At a same time, the control circuit 200 can also integrate one or more of the functional components such as a battery, an antenna structure, a microphone, a speaker, a headset interface, a universal serial bus interface, a camera, a distance sensor, an ambient light sensor, a receiver, and a processor, so that the display device 10 can be adapted to various application fields.

It should be noted that the display device 10 is not limited to above contents, but can further comprise other devices, such as a camera, an antenna structure, a fingerprint unlocking module, etc., so as to expand its scope of use, which is not limited here.

The display device 10 in the embodiments of the present application has a wide range of applications, comprising a TV, a computer, a mobile phone, a flexible display and lighting such as a foldable and curlable display screen, as well as a wearable device such as a smart bracelet and a smart watch, which are all within the application field of the display device 10 in the embodiments of the present application.

The display panel and the display device provided by the embodiments of the present application are introduced in detail. In this paper, specific examples are applied to elaborate the principle and embodiment of the invention. The description of the above embodiment is only used to help understand the technical scheme and core idea of the invention. Those of ordinary skill in the art should understand that they can still modify the technical scheme recorded in the above embodiments, or equivalent replace some of the technical features. These modifications or substitutions do not separate the essence of the corresponding technical scheme from the scope of the technical scheme of each embodiment of the present application.

What is claimed is:

1. A display panel, comprising:
a substrate provided with a plurality of scanning lines and a plurality of data lines, wherein the plurality of scanning lines extend along a first direction and are arranged in parallel along a second direction, the plurality of data lines extend along the second direction and are arranged in parallel along the first direction, and the first direction is at an included angle with the second direction; and
a plurality of light-emitting components arranged on the substrate in parallel along the first direction, wherein each of the plurality of light-emitting components comprises three data lines of the plurality of data lines and two light-emitting units arranged in parallel along the first direction, each of the two light-emitting units comprises a plurality of light-emitting pixels arranged in parallel along the second direction, each of the plurality of light-emitting pixels comprises a plurality of sub light-emitting pixels arranged in parallel along the second direction, and each of the plurality of sub light-emitting pixels is electrically connected with one of the three data lines in a same one of the light-emitting components; and
wherein a number of the scanning lines electrically connected with each of the light-emitting units is less than a number of the sub light-emitting pixels in a corresponding one of the light-emitting units;
a product of the number of the scanning lines electrically connected with each of the light-emitting components and a number of the data lines in a corresponding one of the light-emitting components is greater than or equal to a number of the sub light-emitting pixels in the corresponding one of the light-emitting components; and
the three data lines in each of the plurality of light-emitting components comprises a first data line, a second data line, and a third data line arranged in sequence along the first direction, one of the two light-emitting units in each of at least part of the light-emitting components is arranged between the first data line and the second data line in the corresponding one of the light-emitting components, and another one of the two light-emitting units in each of at least part of the light-emitting components is arranged between the second data line and the third data line in the corresponding one of the light-emitting components.

2. The display panel according to claim 1, wherein along the first direction, one of the plurality of data lines and two of the plurality of data lines are alternately arranged between adjacent two of the light-emitting units in turn.

3. The display panel according to claim 1, wherein the three data lines in each of the plurality of light-emitting components are arranged in a same distribution mode.

4. The display panel according to claim 1, wherein the first direction is perpendicular to the second direction.

5. The display panel according to claim 4, wherein the first direction is a column direction and the second direction is a row direction.

6. The display panel according to claim 1, wherein each of the light-emitting pixels comprises three sub light-emitting pixels, each of at least part of the light-emitting pixels is electrically connected with two scanning lines of the plurality of scanning lines, and each of the sub light-emitting pixels in each of the at least part of the light-emitting pixels is electrically connected with one of the two scanning lines electrically connected with a corresponding one of the at least part of the light-emitting pixels.

7. The display panel according to claim 6, wherein each of the light-emitting pixels is electrically connected with two scanning lines of the plurality of scanning lines.

8. The display panel according to claim 7, wherein each of the two scanning lines is arranged between adjacent two of the sub light-emitting pixels in a corresponding one of the light-emitting pixels.

9. The display panel according to claim 6, wherein each of a part of the light-emitting pixels is electrically connected with two of the plurality of scanning lines, and each of another part of the light-emitting pixels is electrically connected with three of the plurality of scanning lines.

10. The display panel according to claim 1, wherein the substrate is further provided with a plurality of control switches, and a number of the plurality of control switches is equal to a number of the sub light-emitting pixels of the display panel; each of the sub light-emitting pixels is electrically connected with a corresponding one of the plurality of control switches, and each of the plurality of control switches is electrically connected with a corresponding one of the plurality of scanning lines and a corresponding one of the plurality of data lines.

11. The display panel according to claim 10, wherein the plurality of scanning lines and the plurality of data lines form a plurality of cross areas, a number of the plurality of cross areas is equal to the number of the plurality of control switches, and each of the cross areas is provided with one of the control switches.

12. The display panel according to claim 11, wherein each of the plurality of control switches is located at a position near a correspondingly connected one of the sub light-emitting pixels in a corresponding one of the cross areas.

13. The display panel according to claim 10, wherein each of the plurality of control switches comprises a gate electrode, a source electrode, and a drain electrode; the gate electrode is electrically connected with one of the scanning lines, the source electrode is electrically connected with one of the data lines, and the drain electrode is electrically connected with one of the sub light-emitting pixels.

14. The display panel according to claim 13, wherein the gate electrode is arranged on a same layer as the plurality of scanning lines.

15. The display panel according to claim 13, wherein the source electrode and the drain electrode are arranged on a same layer as the plurality of data lines.

16. The display panel according to claim 10, wherein each of the plurality of control switches comprises a gate electrode, a source electrode, and a drain electrode; the gate electrode is electrically connected with one of the scanning lines, the drain electrode is electrically connected with one of the data lines, and the source electrode is electrically connected with one of the sub light-emitting pixels.

17. The display panel according to claim 1, wherein in each of the light-emitting components, each of the sub light-emitting pixels is electrically with one of the scanning lines electrically connected with the corresponding one of the light-emitting components and electrically with one of the three data lines, and a number of the sub light-emitting pixels connected with a same one of the scanning lines and a same one of the three data lines is one.

18. A display panel, comprising:
a substrate provided with a plurality of scanning lines and a plurality of data lines, wherein the plurality of scanning lines extend along a first direction and are arranged in parallel along a second direction, the plurality of data lines extend along the second direction and are arranged in parallel along the first direction, and the first direction is at an included angle with the second direction; and a plurality of light-emitting components arranged on the substrate in parallel along the first direction, wherein each of the plurality of light-emitting components comprises three data lines of the plurality of data lines and two light-emitting units arranged in parallel along the first direction, each of the two light-emitting units comprises a plurality of light-emitting pixels arranged in parallel along the second direction, each of the plurality of light-emitting pixels comprises a plurality of sub light-emitting pixels arranged in parallel along the second direction, and each of the plurality of sub light-emitting pixels is electrically connected with one of the three data lines in a same one of the light-emitting components; and wherein a number of the scanning lines electrically connected with each of the light-emitting units is less than a number of the sub light-emitting pixels in a corresponding one of the light-emitting units;

a product of the number of the scanning lines electrically connected with each of the light-emitting components and a number of the data lines in a corresponding one of the light-emitting components is greater than or equal to a number of the sub light-emitting pixels in the corresponding one of the light-emitting components; and the three data lines in each of the plurality of light-emitting components are located between the two light-emitting units of the corresponding one of the light-emitting components.

19. The display panel according to claim 18, wherein in each of the light-emitting components, each of the sub light-emitting pixels is electrically with one of the scanning lines electrically connected with the corresponding one of the light-emitting components and electrically with one of the three data lines, and a number of the sub light-emitting pixels connected with a same one of the scanning lines and a same one of the three data lines is one.

\* \* \* \* \*